United States Patent
Hill et al.

(10) Patent No.: US 6,787,406 B1
(45) Date of Patent: Sep. 7, 2004

(54) SYSTEMS AND METHODS FOR FORMING DENSE N-CHANNEL AND P-CHANNEL FINS USING SHADOW IMPLANTING

(75) Inventors: Wiley Eugene Hill, Moss Beach, CA (US); Shibly S. Ahmed, San Jose, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/638,334

(22) Filed: Aug. 12, 2003

(51) Int. Cl.[7] .............................................. H01L 21/84
(52) U.S. Cl. ...................... 438/164; 438/302; 438/525; 438/531; 438/944
(58) Field of Search ................................ 438/164, 302, 438/531, 525, 589, 944

(56) References Cited

PUBLICATIONS

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer finFET for the Terabit Era," IEEE Electron Device Letters, vol. 23, No. 1, Jan. 2002, pp. 25–27.

Co–pending U.S. application Ser. No. 10/728,910, filed Dec. 8, 2003, entitled: "SRAM Formation Using Shadow Implantation", 15 page specification, 13 sheets of drawings.

*Primary Examiner*—W. David Coleman
*Assistant Examiner*—Thanh Pham
(74) *Attorney, Agent, or Firm*—Harrity & Snyder, LLP

(57) ABSTRACT

A method facilitates the doping of fins of a semiconductor device that includes a substrate. The method includes forming fin structures on the substrate, where each of the fin structures includes a cap formed on a fin. The method further includes performing a first tilt angle implant process to dope a first one of the fins with n-type impurities and performing a second tilt angle implant process to dope a second one of the fins with p-type impurities.

15 Claims, 19 Drawing Sheets

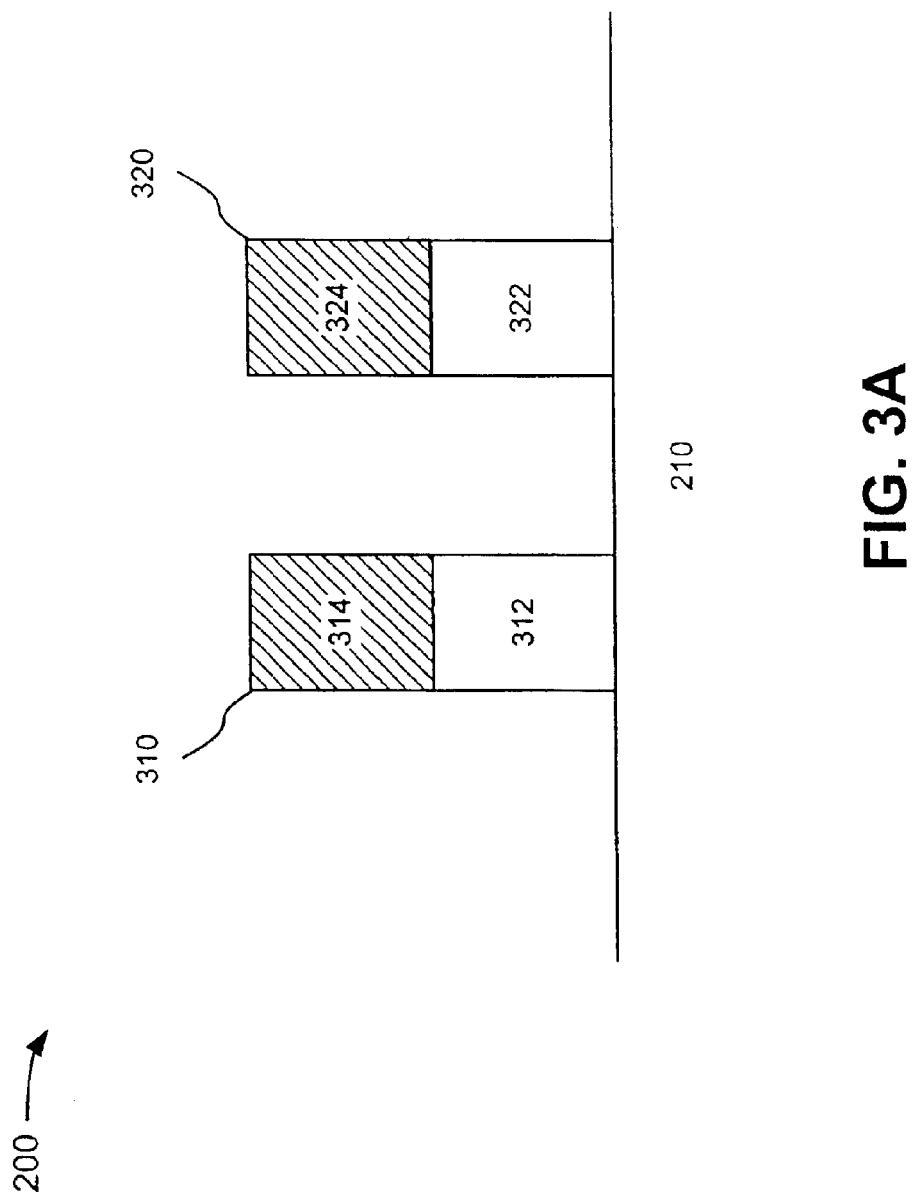

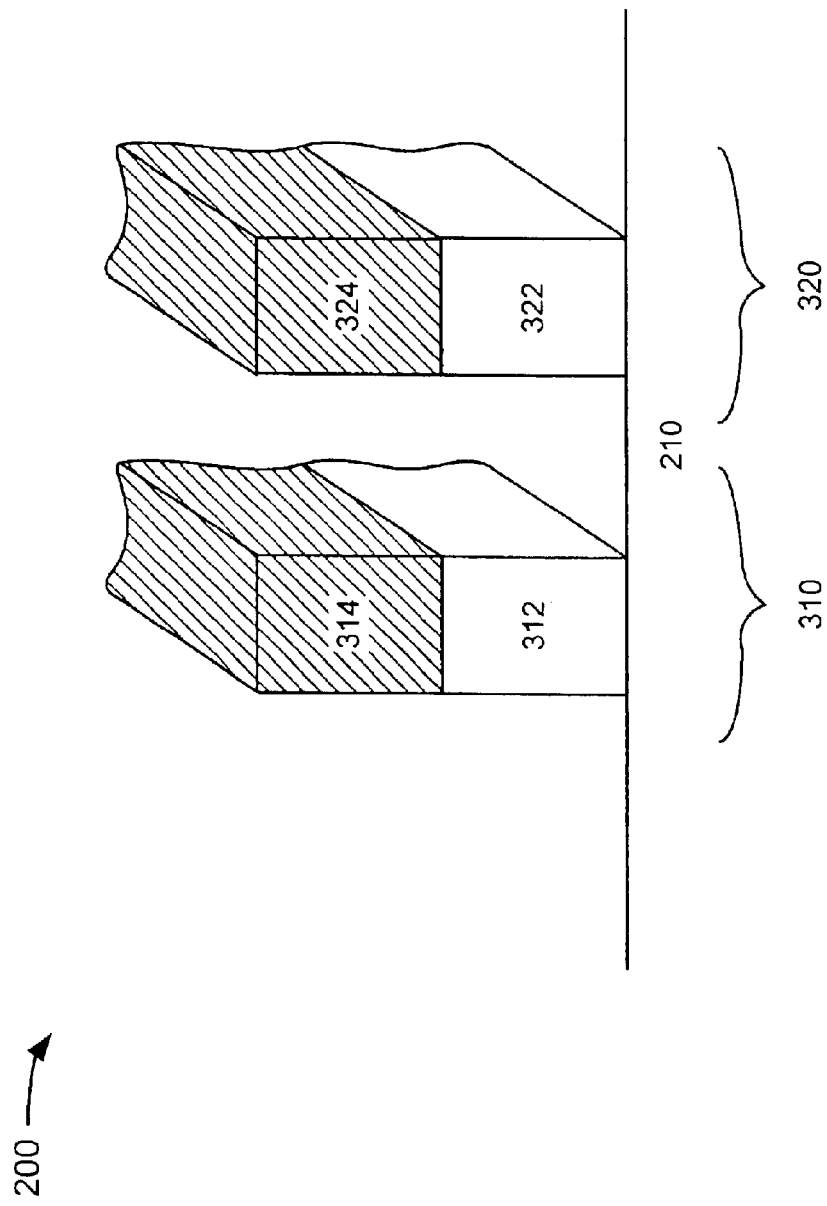

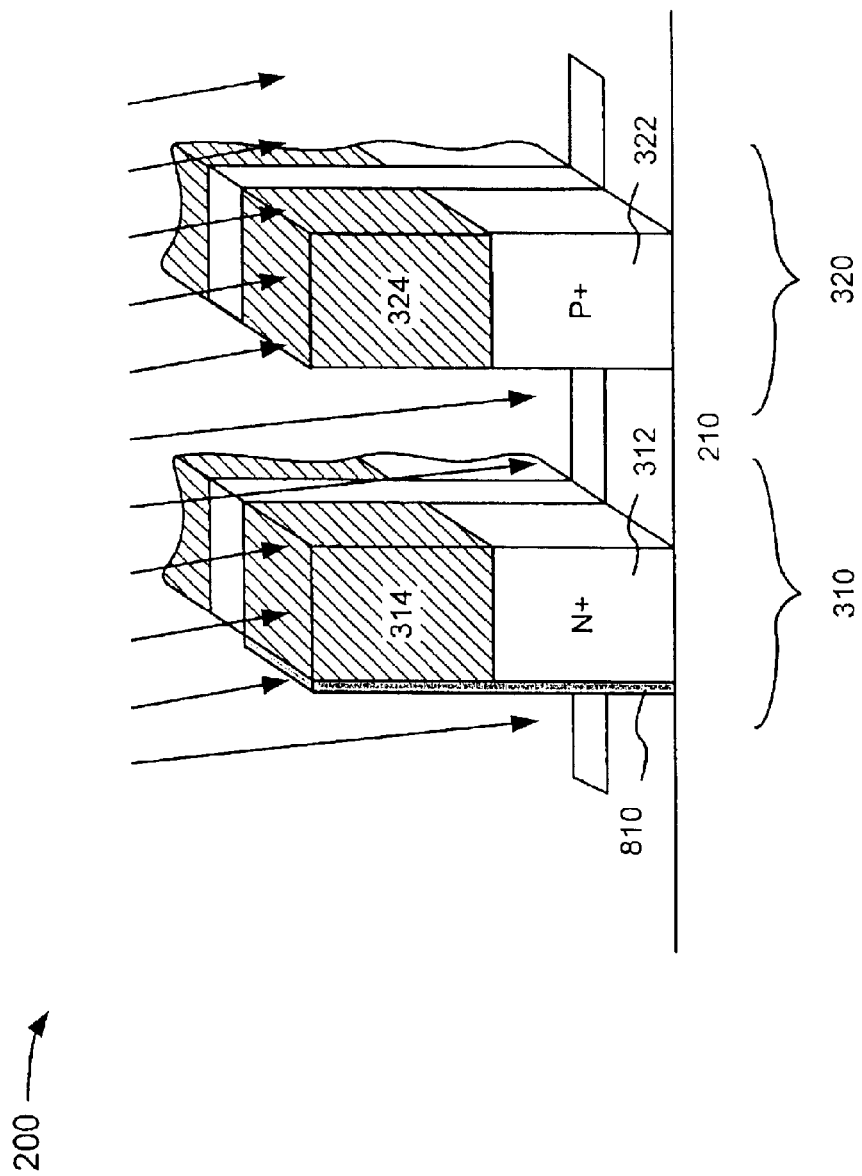

SYSTEMS AND METHODS FOR FORMING DENSE N-CHANNEL AND P-CHANNEL FINS USING SHADOW IMPLANTING

FIELD OF THE INVENTION

The present invention relates generally to semiconductor devices and, more particularly, to systems and methods for creating dense n-channel and p-channel fins for metal-oxide semiconductor field-effect transistor (MOSFET) devices using shadow implanting techniques.

BACKGROUND OF THE INVENTION

The escalating demands for high density and performance associated with ultra large scale integration semiconductor devices require design features, such as gate lengths, below 100 nanometers (nm), high reliability, and increased manufacturing throughput. The reduction of design features below 100 nm challenges the limitations of conventional methodology.

Double-gate MOSFETs represent devices that are candidates for succeeding existing planar MOSFETs. In double-gate MOSFETs, the use of two gates to control the channel significantly suppresses short-channel effects. A FinFET is a double-gate structure that includes a channel formed in a vertical fin. Although a double-gate structure, the FinFET is similar to existing planar MOSFETs in layout and fabrication techniques. The FinFET also provides a range of channel lengths, CMOS compatibility, and large packing density compared to other double-gate structures.

SUMMARY OF THE INVENTION

Implementations consistent with the principles of the invention provide n-channel and p-channel fins for MOSFET devices that are tightly spaced and formed using shadowed implant techniques.

In one aspect consistent with the principles of the invention, a method for doping fins of a semiconductor device that includes a substrate is provided. The method includes forming fin strictures on the substrate, where each of the fin structures includes a cap formed on a fin. The method further includes performing a first tilt angle implant process to dope a first one of the fins with n-type impurities and performing a second tilt angle implant process to dope a second one of the fins with p-type impurities.

According to another aspect, a semiconductor device includes fins formed adjacent to one another, where a distance between side surfaces of the fins is approximately 200 Å. The device further includes a source region formed at one end of the fins, a drain region formed at an opposite end of the fins, and at least one gate.

According to a further aspect, a method for doping fins of a semiconductor device that includes a substrate is provided. The method includes forming fin structures on the substrate, where each of the fin structures includes a cap portion formed on a fin portion. The method also includes performing a first tilt angle implant process to dope a first one of the fin portions with n-type impurities from a first direction and performing a second tilt angle implant process to dope a second one of the fin portions with p-type impurities from a second direction. The method further includes performing a third tilt angle implant process to further dope the first one of the fin portions with n-type impurities from the second direction and performing a fourth tilt angle implant process to further dope the second one of the fin portions with p-type impurities from the first direction.

BRIEF DESCRIPTION OF THE DRAWINGS

The accompanying drawings, which are incorporated in and constitute a part of this specification, illustrate an embodiment of the invention and, together with the description, explain the invention. In the drawings.

FIGS. 2–9 illustrate exemplary views of a MOSFET fabricated according to the processing described in FIG. 1.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide tightly spaced n-channel and p-channel fins that may be fabricated using shadowed implant techniques.

Figure 1:
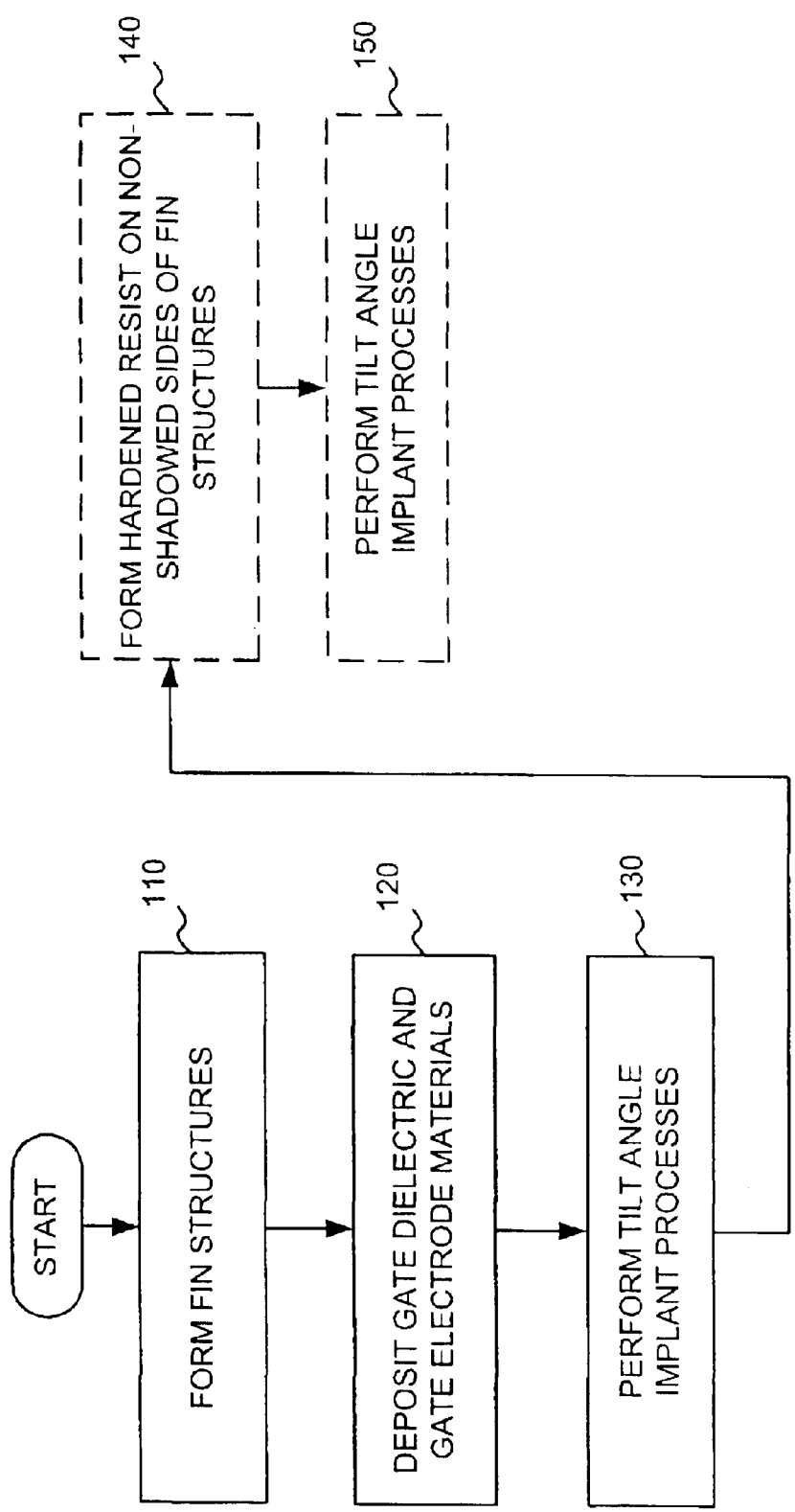
FIG. 1 illustrates an exemplary process for fabricating n-channel and p-channel fins of a MOSFET according to an implementation consistent with the principles of the invention.

FIG. 1 illustrates an exemplary process for forming densely spaced n-channel and p-channel fins for a MOSFET according to an implementation consistent with the principles of the invention. FIGS. 2–9 illustrate exemplary views of a MOSFET fabricated according to the processing described with regard to FIG. 1.

Figure 2:
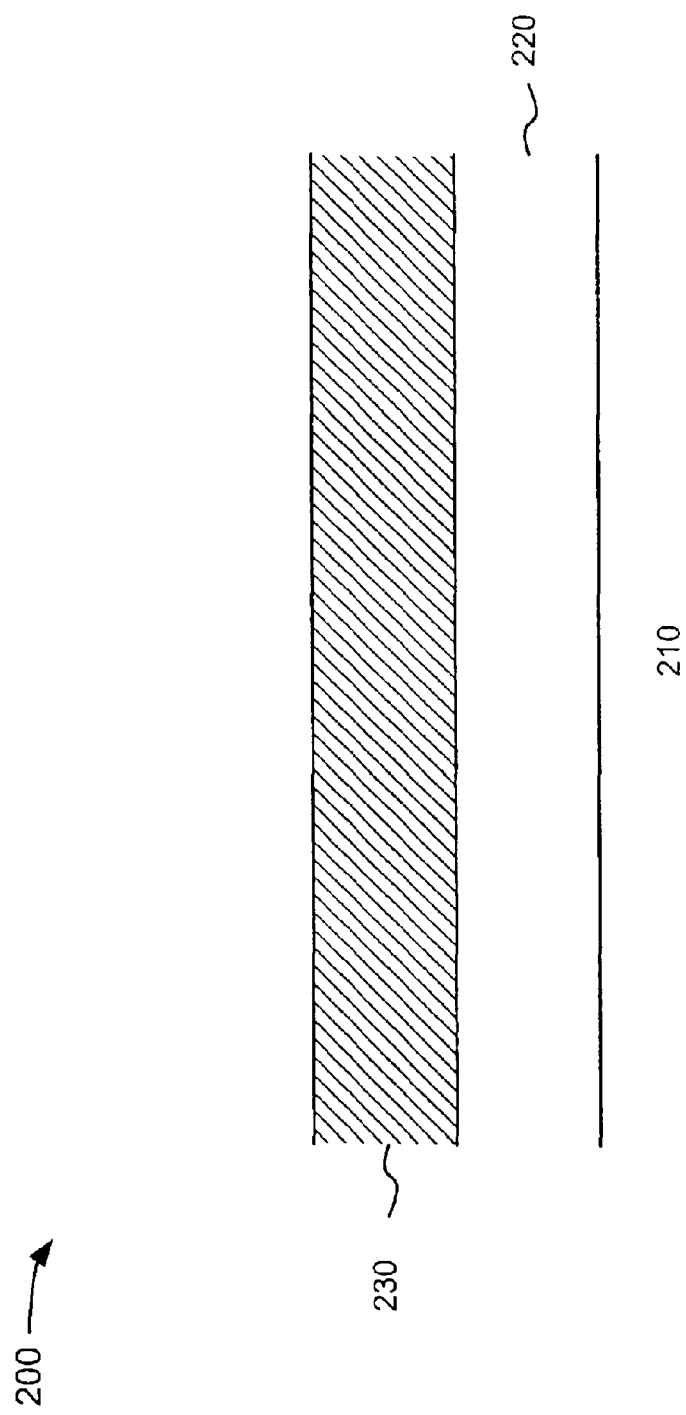

With reference to FIGS. 1 and 2, processing may begin with semiconductor device 200. Semiconductor device 200 may include a silicon on insulator (SOI) structure that includes a buried oxide layer on a silicon substrate (collectively shown in FIG. 2 as substrate 210) and a silicon layer 220 formed on the buried oxide layer. In alterative implementations, substrate 210 and layer 220 may include other semiconductor materials, such as germanium, or combinations of semiconductor materials, such as silicon-germanium. The buried oxide layer may include a silicon oxide or other types of dielectric materials.

Silicon layer 220 may be formed on substrate 210 using a conventional deposition technique. The thickness of silicon layer 220 may range from about 200 Å to 300 Å. In an exemplary implementation, silicon layer 220 may be deposited to a thickness of approximately 250 Å. It will be appreciated that silicon layer 220 may be used to form one or more fins.

A thick cap layer 230 (or hard mask) may be formed on top of silicon layer 220 to aid in pattern optimization and protect silicon layer 220 during subsequent processing. Cap layer 230 may, for example, include a silicon nitride material or some other type of material capable of protecting silicon layer 220 during the fabrication process. Cap layer 230 may be deposited, for example, by chemical vapor deposition (CVD) to a thickness ranging from approximately 200 Å to 300 Å. In an exemplary implementation, cap layer 230 may be deposited to a thickness of approximately 250 Å.

Silicon layer 220 may be patterned by conventional lithographic techniques (e.g., optical or electron beam (EB) lithography). Silicon layer 220 may then be etched using wellknown etching techniques to form multiple fin structures 310 and 320 (act 110), as illustrated in FIG. 3A. FIG. 3B shows a three dimensional view of FIG. 3A. In implementations consistent with the principles of the invention, there may be more fin structures than are shown in FIGS. 3A and 3B.

As shown in FIGS. 3A and 3B, fin structure 310/320 includes a fin 312/322 and a cap 314/324. Cap 314/324 may remain covering fin 312/322. The width of fin structures 310 and 320 may range from approximately 200 Å to 300 Å. In an exemplary implementation, the width of each of fin structures 310 and 320 may be approximately 250 Å. A distance between side surfaces of fin structure 310 and fin structure 320 may range from approximately 200 Å to 300 Å. In an exemplary implementation, the distance between side surfaces of fin structures 310 and 320 may be approximately 250 Å.

Figure 4A:
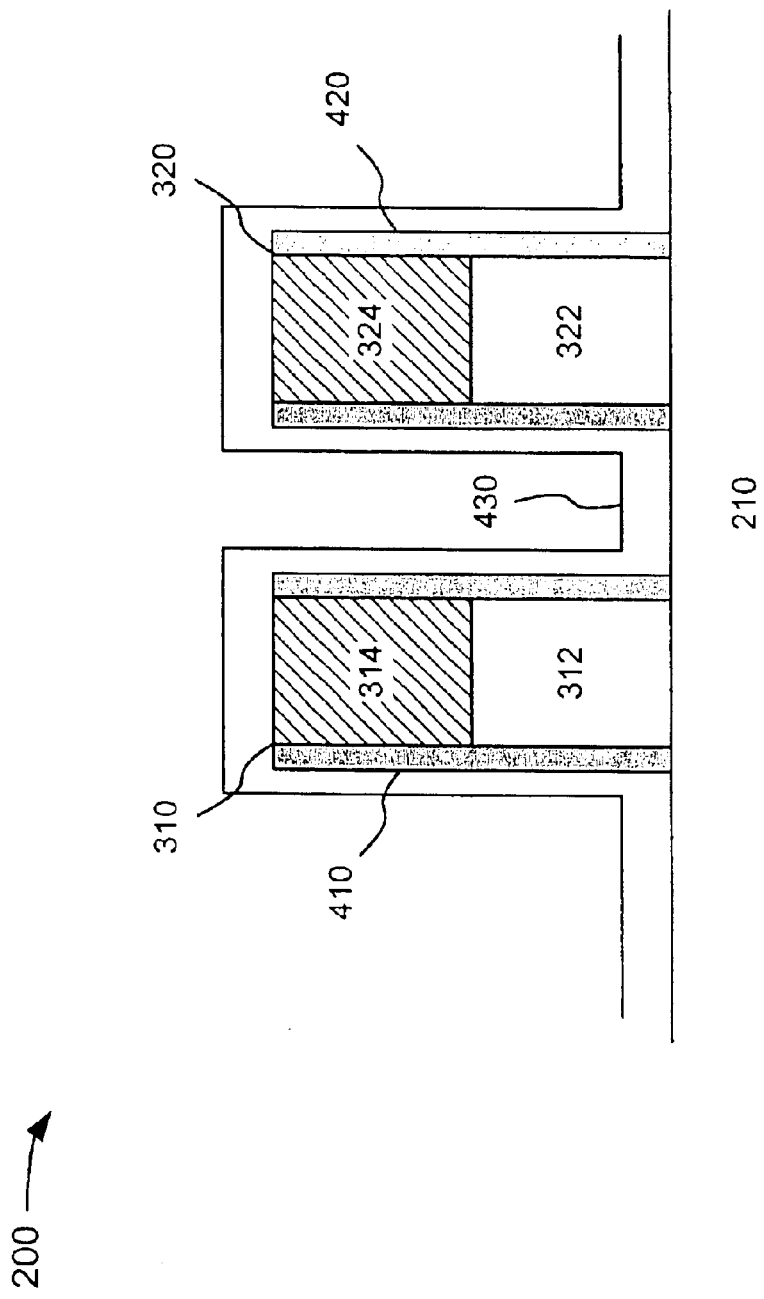
Figure 4B:
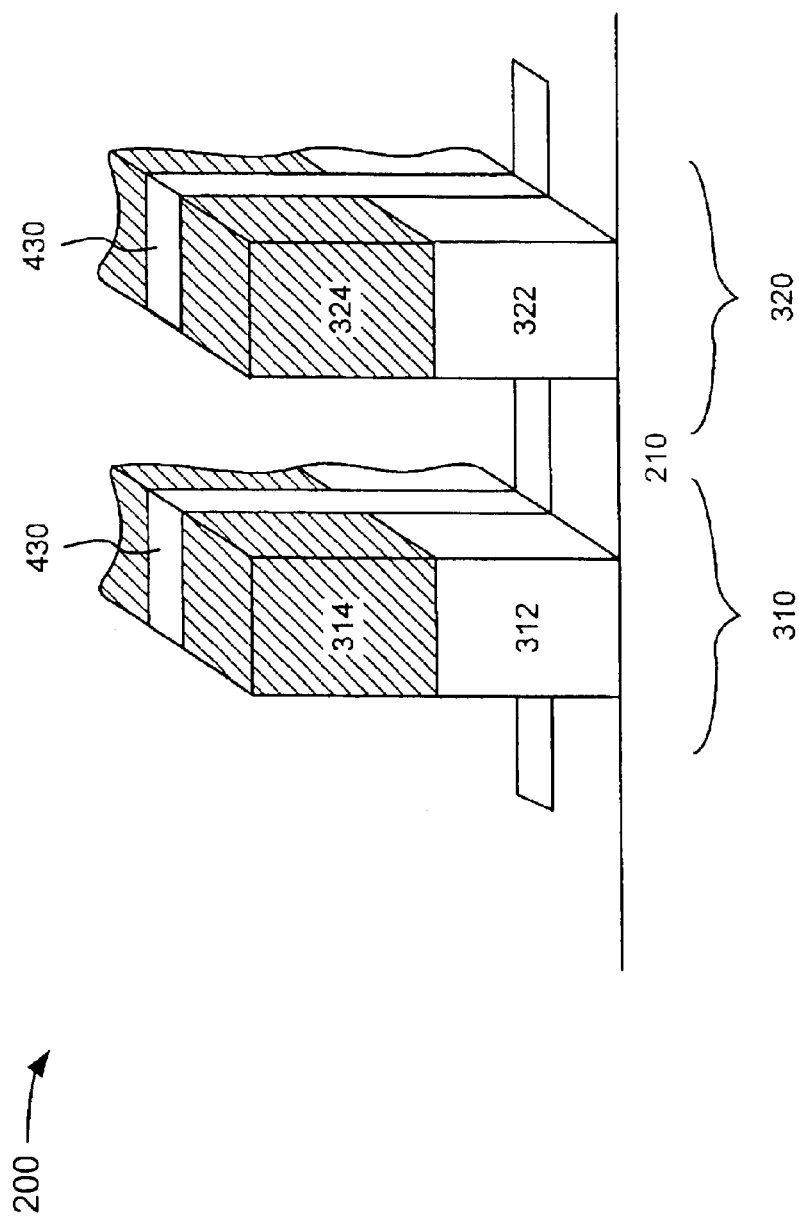

Following the formation of fin structures 310 and 320, gate dielectric material 410/420 and gate electrode material 430 may be deposited (act 120), as illustrated in FIG. 4A. FIG. 4B shows a three dimensional view of FIG. 4A. For example, gate dielectric material 410 may be deposited or thermally grown on the side surfaces of fin structure 310 and a gate dielectric material 420 may be deposited or thermally grown on the side surfaces of fin structure 320 using known techniques, as illustrated in FIG. 4A. While FIG. 4A shows gate dielectric material 410/420 as being formed on only the side surfaces of fin structure 310/320, this need not be the case. Alternatively, gate dielectric material 410/420 may be formed also on the top surface of fin structure 310/320 or on only side surfaces of fin 312/322.

Gate dielectric material 410/420 may be formed at a thickness ranging from approximately 15 Å to 20 Å. Gate dielectric material 410/420 may include conventional dielectric materials, such as an oxide (e.g., silicon dioxide). In other implementations, a nitride material, such as a silicon nitride, may be used as the gate dielectric material.

A gate electrode material 430 may then be deposited over semiconductor device 200 to cover surfaces of fin structure 310/320, as illustrated in FIG. 4A. A number of materials may be used for gate electrode material 430. For example, gate electrode material 430 may include an undoped polycrystalline silicon or other types of conductive material, such as germanium or combinations of silicon and germanium. Gate electrode material 430 may be formed at a thickness ranging from approximately 200 Å to 300 Å.

As shown in FIG. 4B, gate dielectric material 410/420 and gate electrode material 430 may be deposited over a portion of fin structure 310/320, such as a portion of fin structure 310/320 that is to be used for forming a gate structure. A mask (not shown) may then be formed over gate dielectric material 410/420 and gate electrode material 430 to protect them during subsequent processing.

Figure 5A:
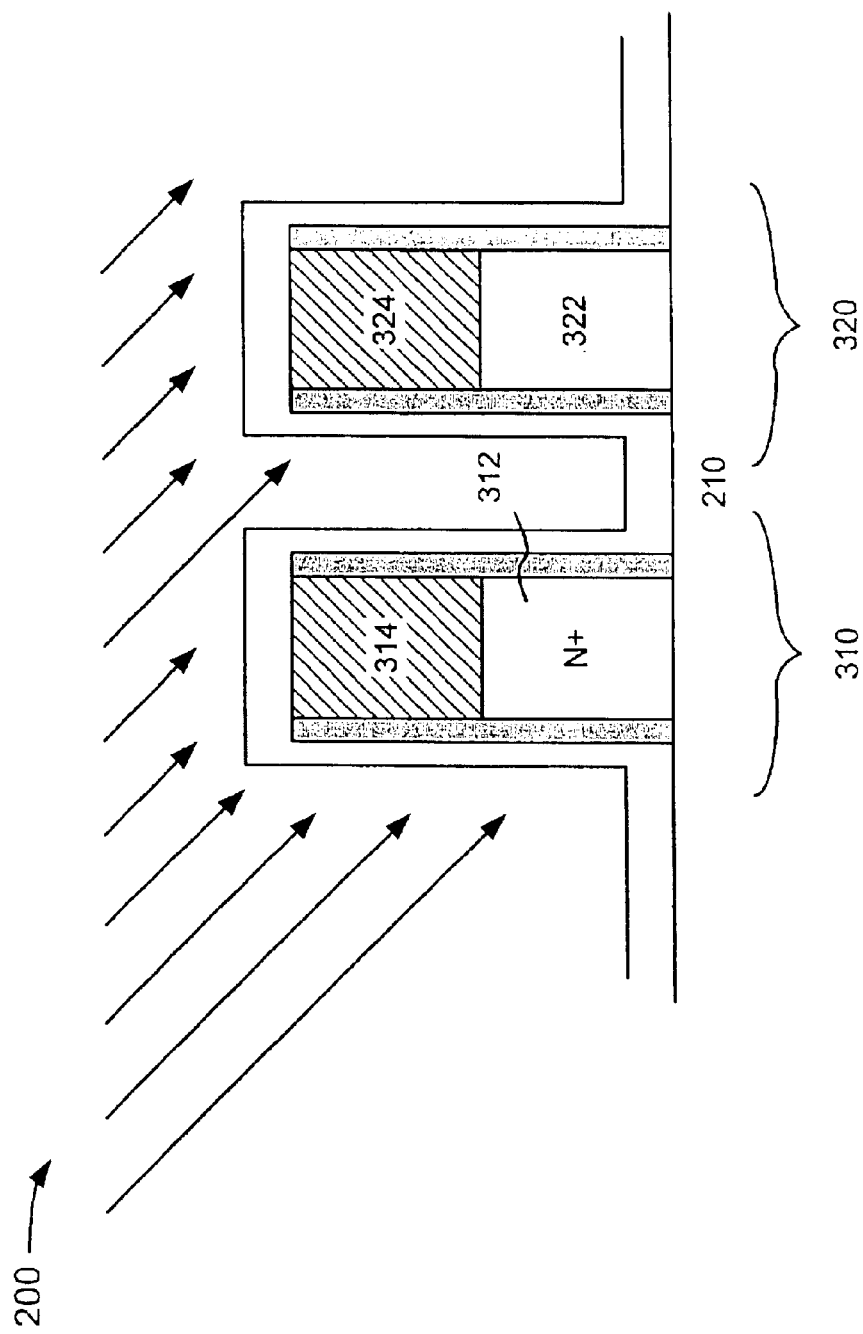
Figure 5B:
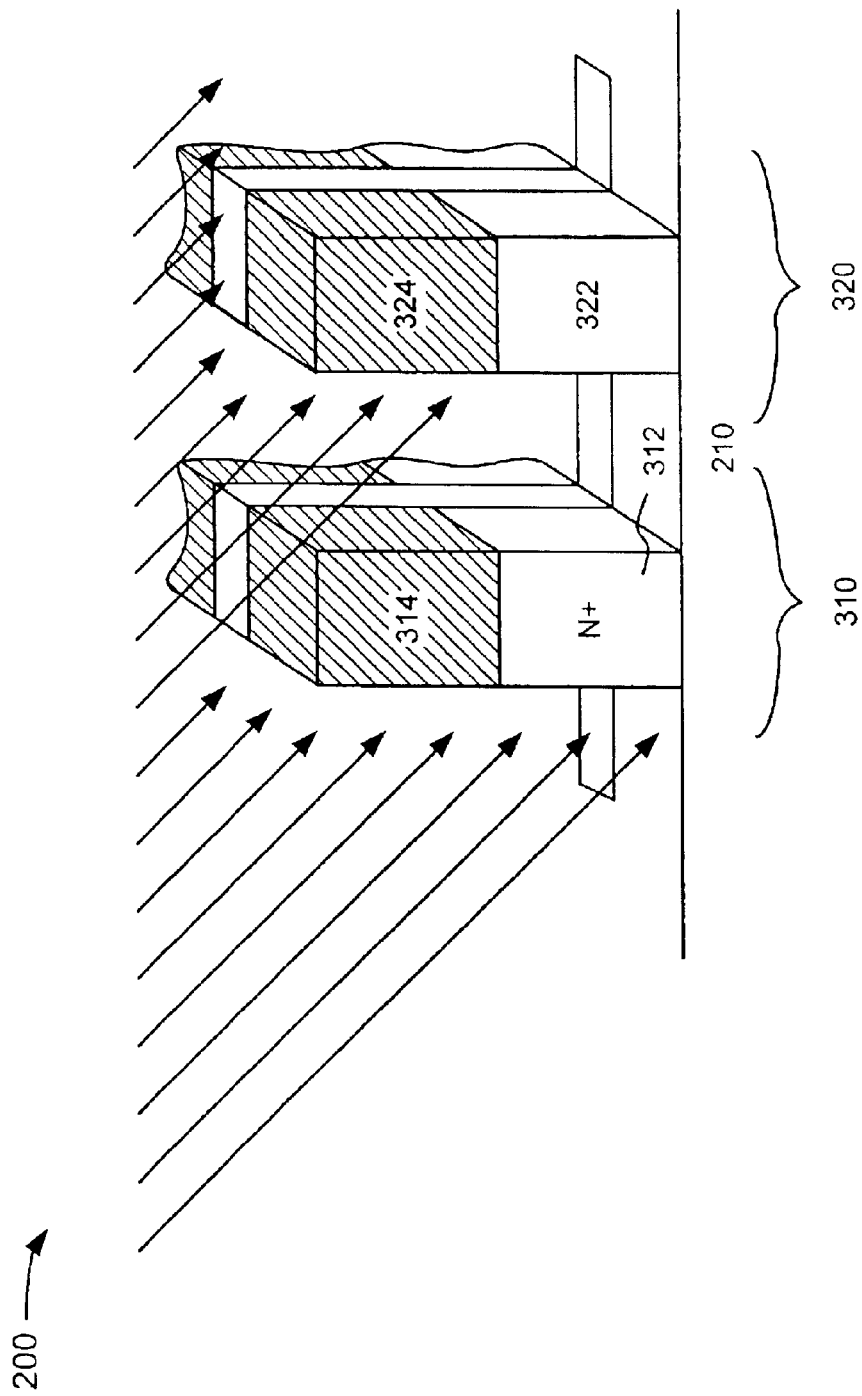

A tilt angle implant processes may then be performed to dope fins 312 and 322 (act 130). For example, a conventional implant process of n-type impurities, such as arsenic or phosphorus, may be performed to dope fin 312, as illustrated in FIG. 5A. FIG. 5B shows a three dimensional view of FIG. 5A. As shown in FIGS. 5A and 5B, n-type impurities may be implanted at an angle ranging from approximately 40 degrees to 50 degrees. In an exemplary implementation, the implant process may be performed at an angle of approximately 45 degrees. The particular angle used may be dependent upon the height of cap 314/324. For example, if the height of cap 314/324 is approximately equal to the height of fin 312/322, then the angle used may be less than or equal to 45 degrees.

The n-type impurities may be implanted at a dosage of about $5 \times 10^{14}$ atoms/cm$^2$ to about $1 \times 10^{15}$ atoms/cm$^2$ and an implantation energy of about 3–6 KeV for phosphorus or about 5–10 KeV for arsenic, which may depend on the thickness of fin 312. After the implant process is complete, fin 312 may include silicon doped predominately, or only, with n-type impurities, as illustrated in FIGS. 5A and 5B.

As shown in FIGS. 5A and 5B, the implanting of n-type impurities does not dope fin 322. There are several factors that aid in preventing the n-type impurities from reaching fin 322. For example, the presence, height, and closeness of fin structure 310 shields or shadows fin 322, thereby blocking the n-type impurities from reaching fin 322. The presence of cap 324 also helps block the n-type impurities.

Figure 6A:
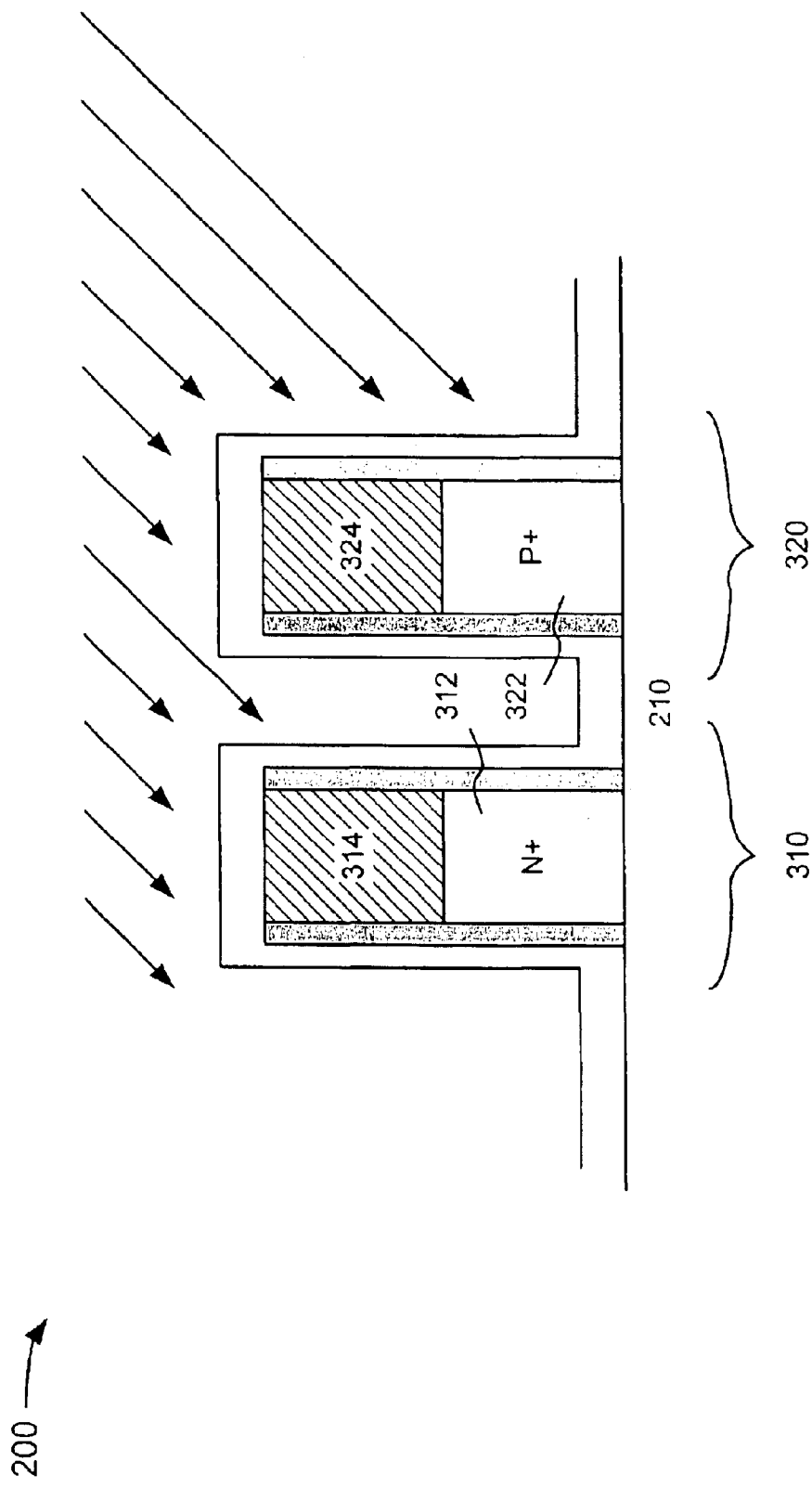
Figure 6B:
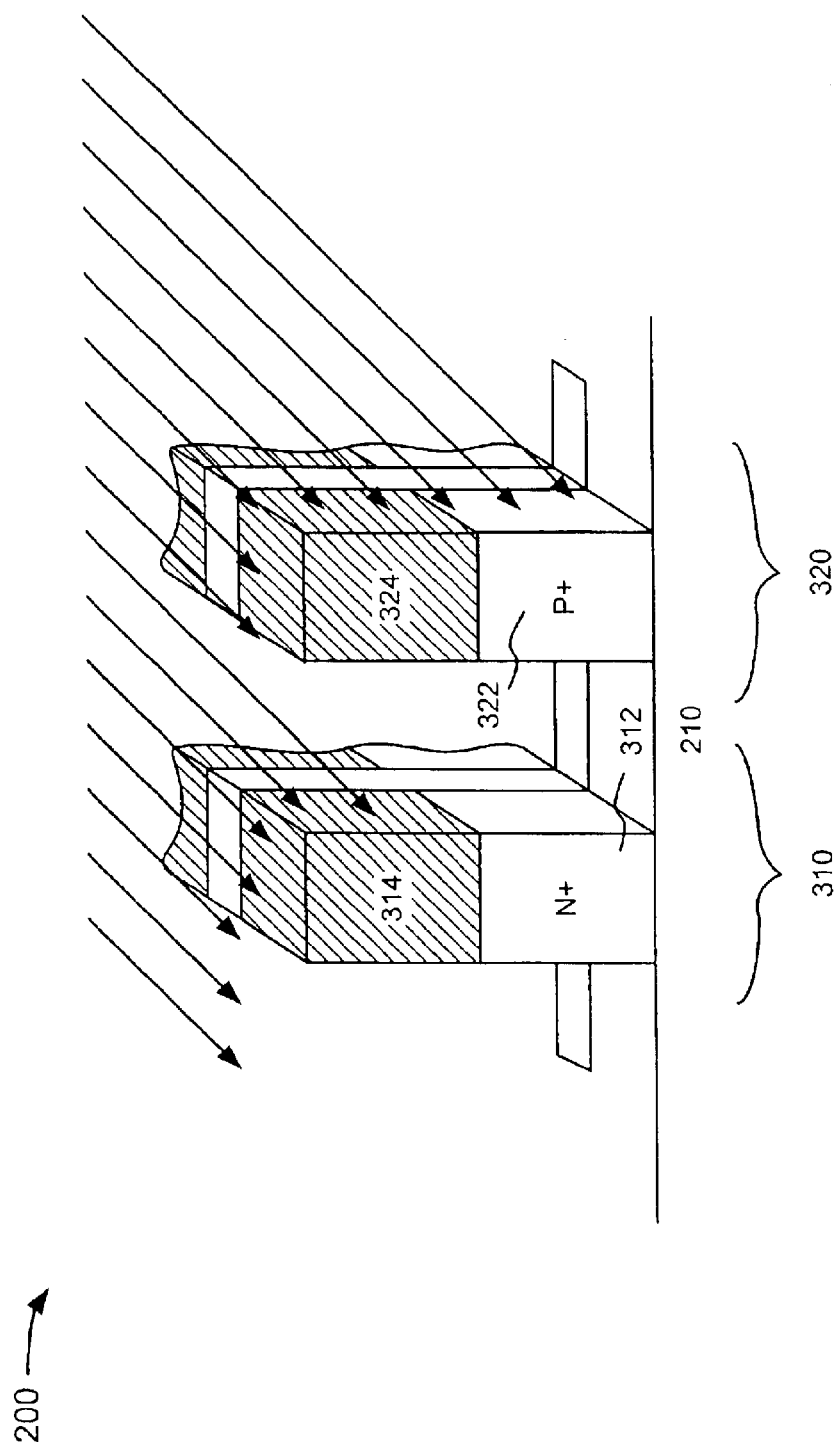

A tilt angle implant process of p-type impurities, such as boron or BF$_2$, may be performed to dope fin 322, as illustrated in FIG. 6A. FIG. 6B shows a three dimensional view of FIG. 6A. As shown in FIGS. 6A and 6B, p-type impurities may be implanted at an angle ranging from approximately 40 degrees to 50 degrees. In an exemplary implementation, the implant process may be performed at an angle of approximately 45 degrees. The particular angle used may be dependent upon the height of cap 314/324. For example, if the height of cap 314/324 is approximately equal to the height of fin 312/322, then the angle used may be less than or equal to 45 degrees.

The p-type impurities may be implanted at a dosage of about $5 \times 10^{14}$ atoms/cm$^2$ to about $1 \times 10^{15}$ atoms/cm$^2$ and an implantation energy of about 2 KeV to about 3 KeV for boron, which may depend on the thickness of fin 322. After the implant process is complete, fin 322 may include silicon doped predominately, or only, with p-type impurities, as illustrated in FIGS. 6A and 6B.

As shown in FIGS. 6A and 6B, the implanting of p-type impurities does not dope fin 312. There are several factors that aid in preventing the p-type impurities from reaching fin 312. For example, the presence, height, and closeness of fin structure 320 shields or shadows fin 312, thereby blocking the p-type impurities from reaching fin 312. The presence of cap 314 also helps block the p-type impurities.

It may also be desirable to dope fins 312 and 322 from the other side (i.e., the sides of fins 312 and 322 facing each other). This may be desirable in instances where the dopant does not fully dope fins 312 and 322.

Figure 7A:
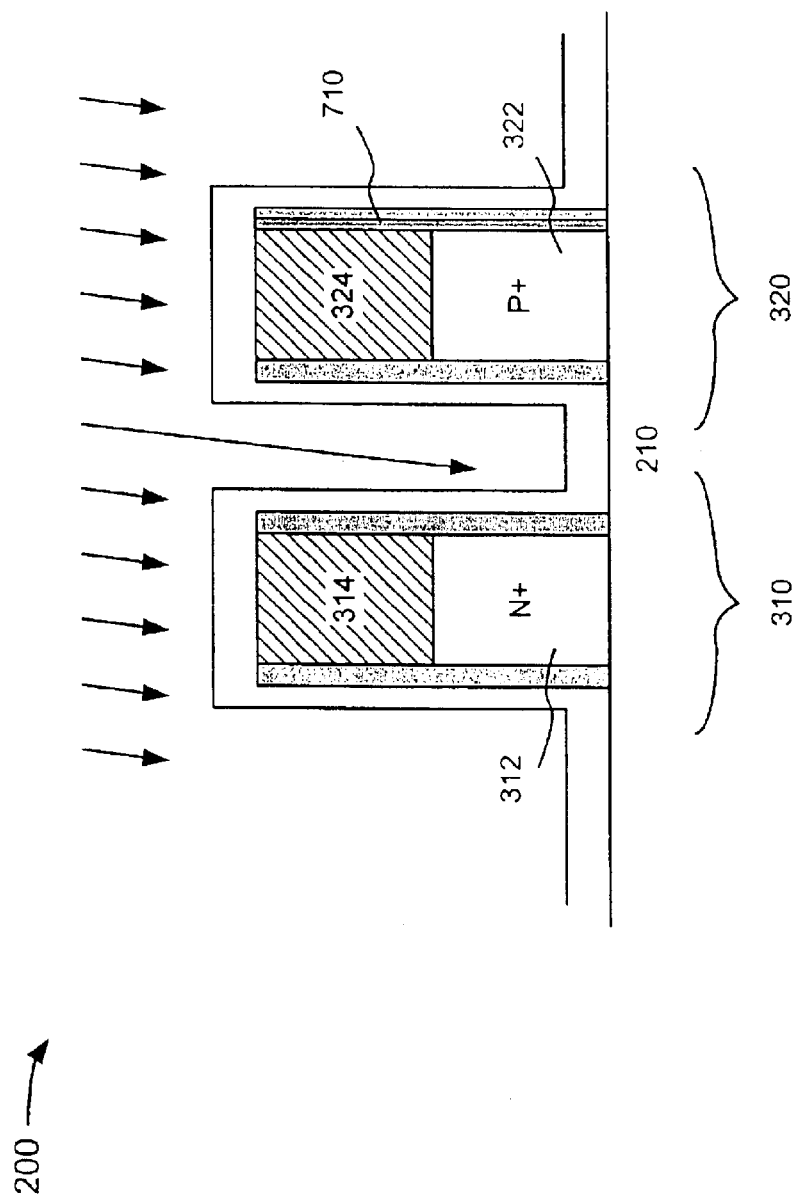
Figure 7B:
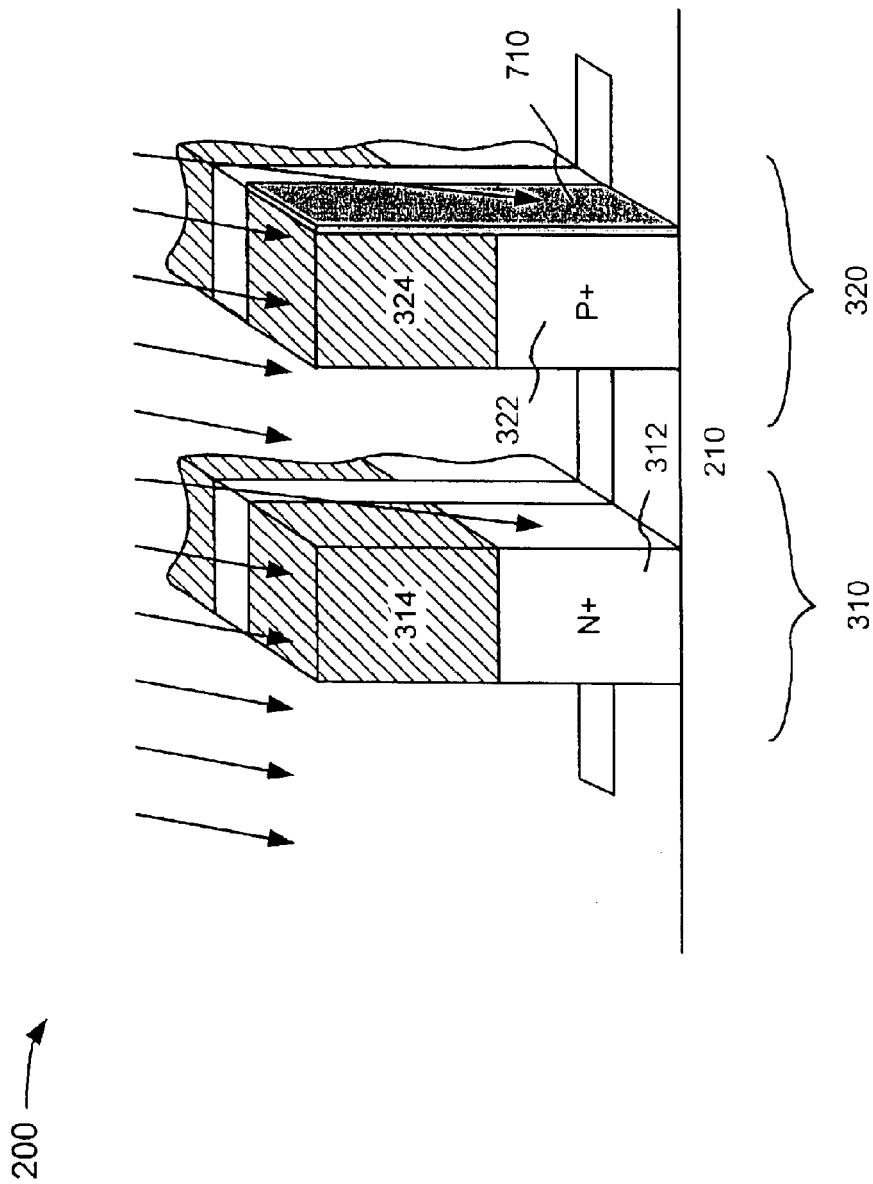

In this case, a hardened resist 710 may optionally be formed on non-shadowed sides of fin structures 310 and 320 (act 140). Another group of tilt angle implant processes may then optionally be performed to dope fins 312 and 322 (act 150). For example, a hardened resist 710 may be formed on the non-shadowed side surface of fin structure 320, as illustrated in FIG. 7A. FIG. 7B shows a three dimensional view of FIG. 7A. Resist 710 may be formed to a thickness ranging from approximately 100 Å to 200 Å. In an exemplary implementation, resist 710 may be formed to a thickness of approximately 150 Å. While FIG. 7B shows resist 710 covering only a portion of fin structure 320, resist 710 may be formed to cover the entire non-shadowed side of fin structure 320 on both sides of, and possibly covering at least a portion of, gate electrode material 430.

A conventional implant process of n-type impurities, such as arsenic or phosphorus, maybe performed to dope fin 312, as illustrated in FIGS. 7A and 7B. The n-type impurities may be implanted at an angle ranging from approximately 40 degrees to 50 degrees. In an exemplary implementation, the implant process may be performed at an angle of approximately 45 degrees.

The n-type impurities may be implanted at a dosage of about $5\times10^{14}$ atoms/cm$^2$ to about $1\times10^{15}$ atoms/cm$^2$ and an implantation energy of about 3–6 KeV for phosphorus or about 5–10 KeV for arsenic, which may depend on the thickness of fin 312. After the implant process is complete, fin 312 may include silicon doped predominately, or only, with n-type impurities, as illustrated in FIGS. 7A and 7B. The implanting of n-type impurities does not dope fin 322. For example, resist 710 and cap 324 block the n-type impurities from reaching fin 322.

Figure 8A:
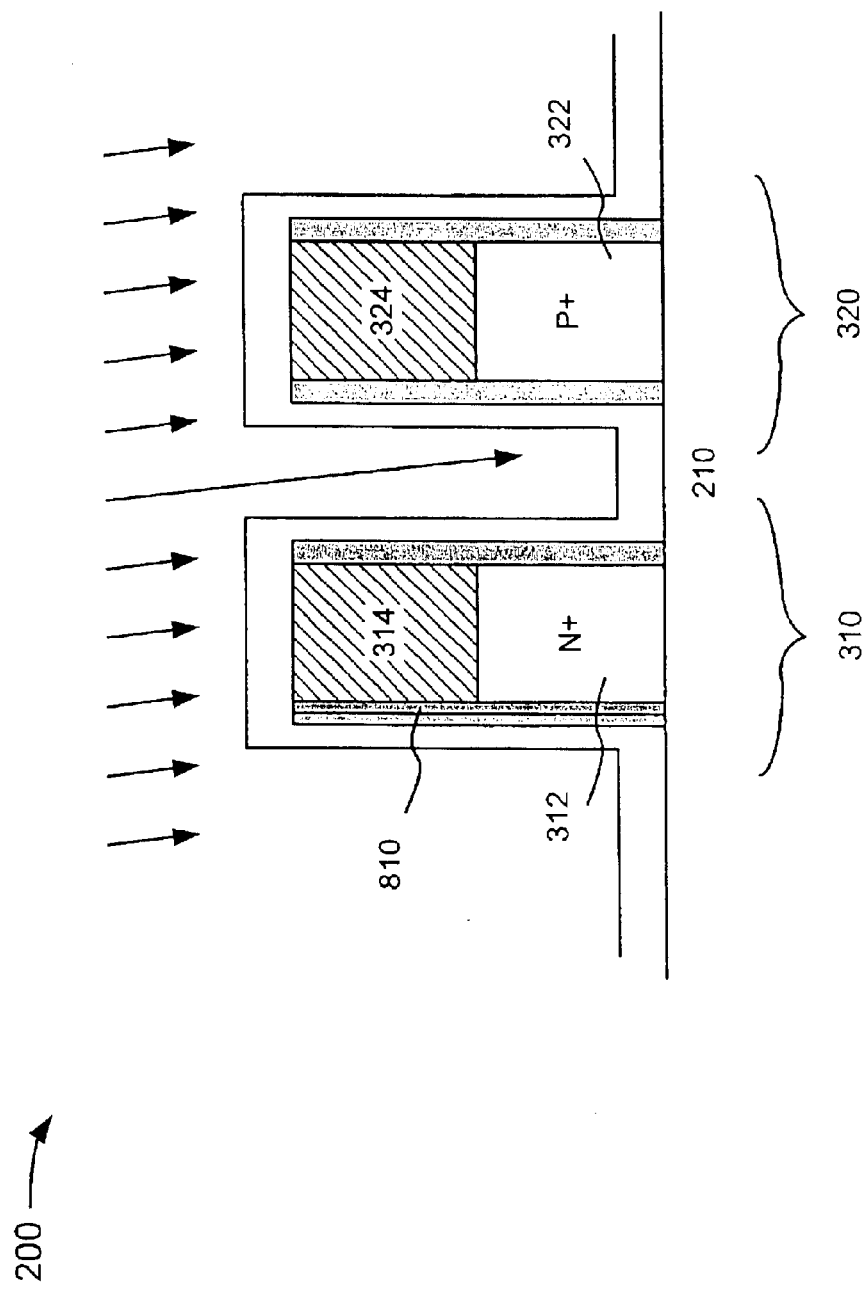

A hardened resist 810 may optionally be formed on the non-shadowed side surface of fin structure 312, as illustrated in FIG. 8A. FIG. 8B shows a three dimensional view of FIG. 8A. Resist 810 may be formed to a thickness ranging from approximately 100 Å to 200 Å. In an exemplary implementation, resist 810 may be formed to a thickness of approximately 150 Å. While FIG. 8B shows resist 810 covering only a portion of fin structure 310, resist 810 may be formed to cover the entire non-shadowed side of fin structure 310 on both sides of, and possibly covering at least a portion of, gate electrode material 430.

A conventional implant process of p-type impurities, such as boron or BF$_2$, may then be optionally performed to dope fin 322, as illustrated in FIGS. 8A and 8B. The p-type impurities may be implanted at an angle ranging from approximately 40 degrees to 50 degrees. In an exemplary implementation, the implant process may be performed at an angle of approximately 45 degrees.

The p-type impurities may be implanted at a dosage of about $5\times10^{14}$ atoms/cm$^2$ to about $1\times10^{15}$ atoms/cm$^2$ and an implantation energy of about 2 KeV to about 3 KeV for boron, which may depend on the thickness of fin 322. After the implant process is complete, fin 322 may include silicon doped predominately, or only, with p-type impurities, as illustrated in FIGS. 8A and 8B. The implanting of p-type impurities does not dope fin 312. For example, resist 810 and cap 314 block the p-type impurities from reaching fin 312.

After doping of fins 312 and 322, conventional FinFET fabrication processing can be used to complete the transistor (e.g., forming the source and drain regions, contacts, interconnects and inter-level dielectrics for the FinFET device). For example, any remaining resist 710 or 810 may be stripped. Also, caps 314 and 324 may be removed. One or more gates may then be formed using conventional processing.

Figure 9:
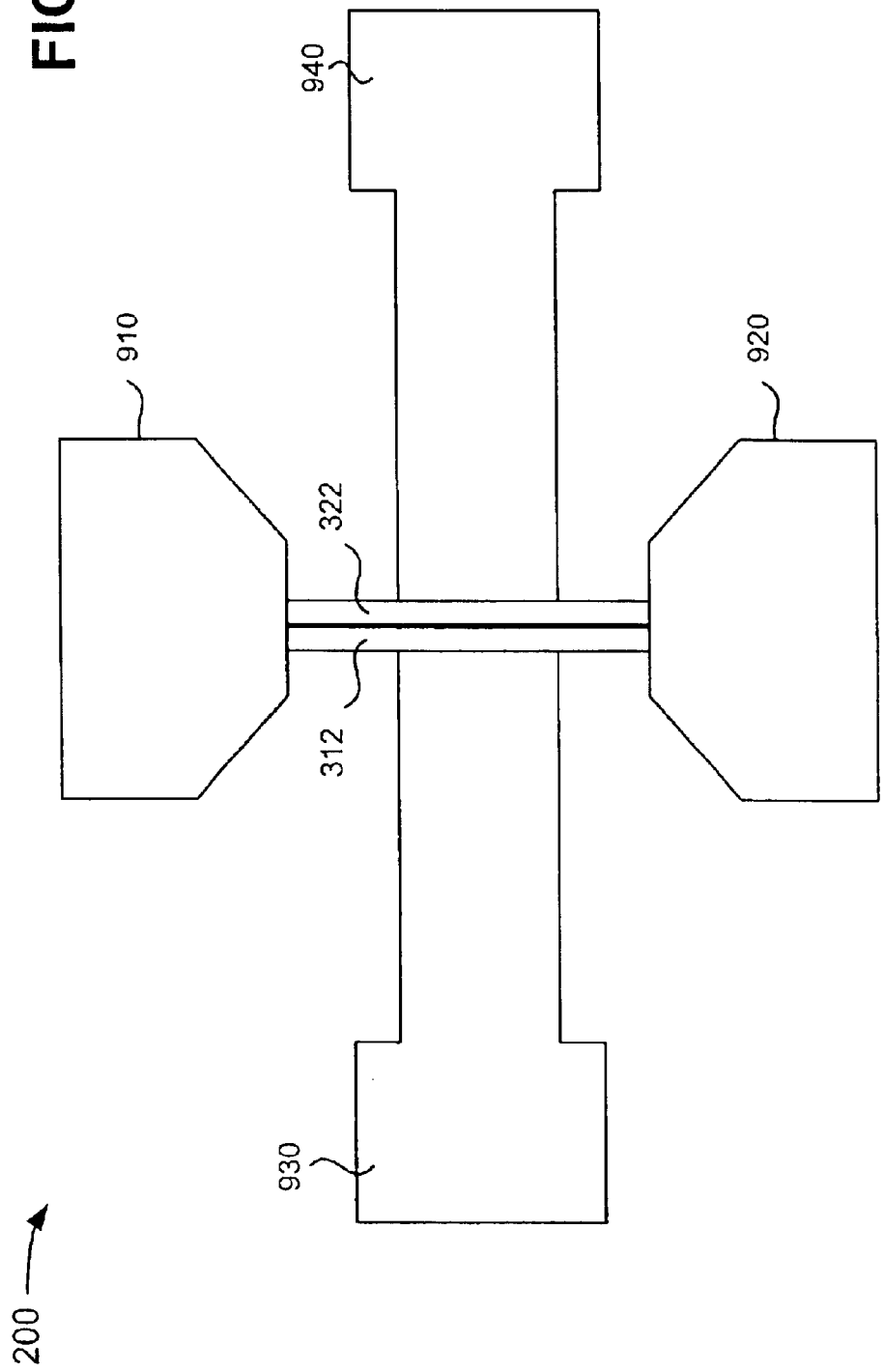

FIG. 9 illustrates an exemplary top view of semiconductor device 200 consistent with the principles of the invention after the source/drain regions and gate electrodes are formed. As illustrated, the semiconductor device includes a double-gate structure with fins 312 and 322, source and drain regions 910 and 920, and gate electrodes 930 and 940.

A method has been described above as doping two fin structures for a FinFET device. It should be understood that methods consistent with the present invention may be used to form or dope any number of fin structures, such as more than two fin structures, based on the particular circuit requirements.

OTHER IMPLEMENTATIONS

Figure 10:
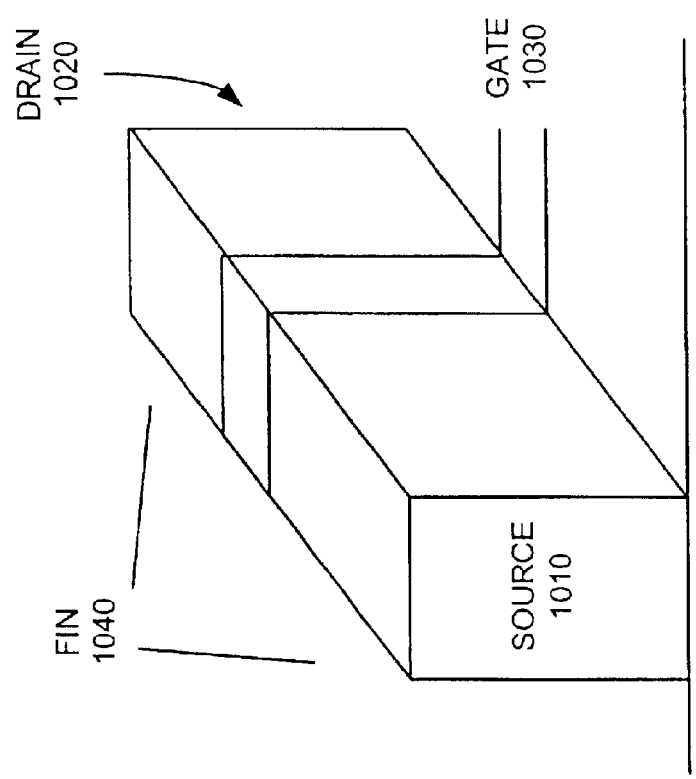
FIGS. 10–13 illustrate features associated with a FinFET device with different threshold voltages on either side of a common gate.
Figure 11:
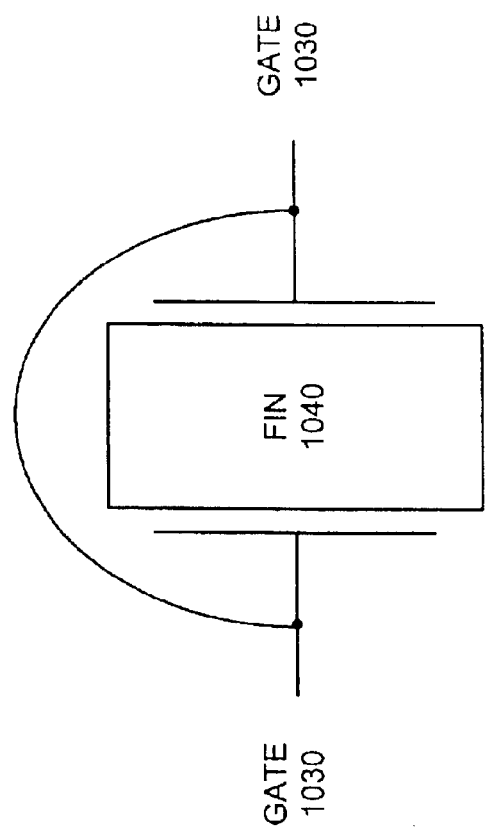
Figure 12:
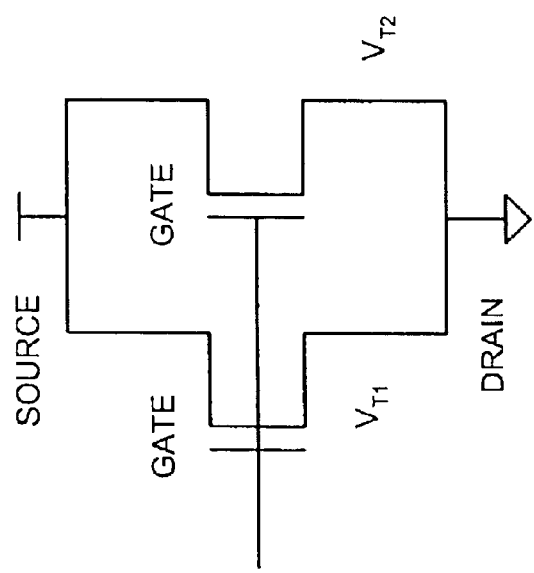

It may be desirable to produce a FinFET device with different threshold voltages ($V_T$'S). FIGS. 10–13 illustrate features associated with such a FinFET device. A source 1010, a drain 1020, and a common gate 1030 may be formed using conventional FinFET techniques, as illustrated in FIG. 10. Source 1010 and drain 1020 may be connected via fin 1040. Gate 1030 maybe a common gate connected on either side of fin 1040, as illustrated in FIG. 11. FIG. 12 is a schematic diagram illustrating this common gate connection.

Figure 13:
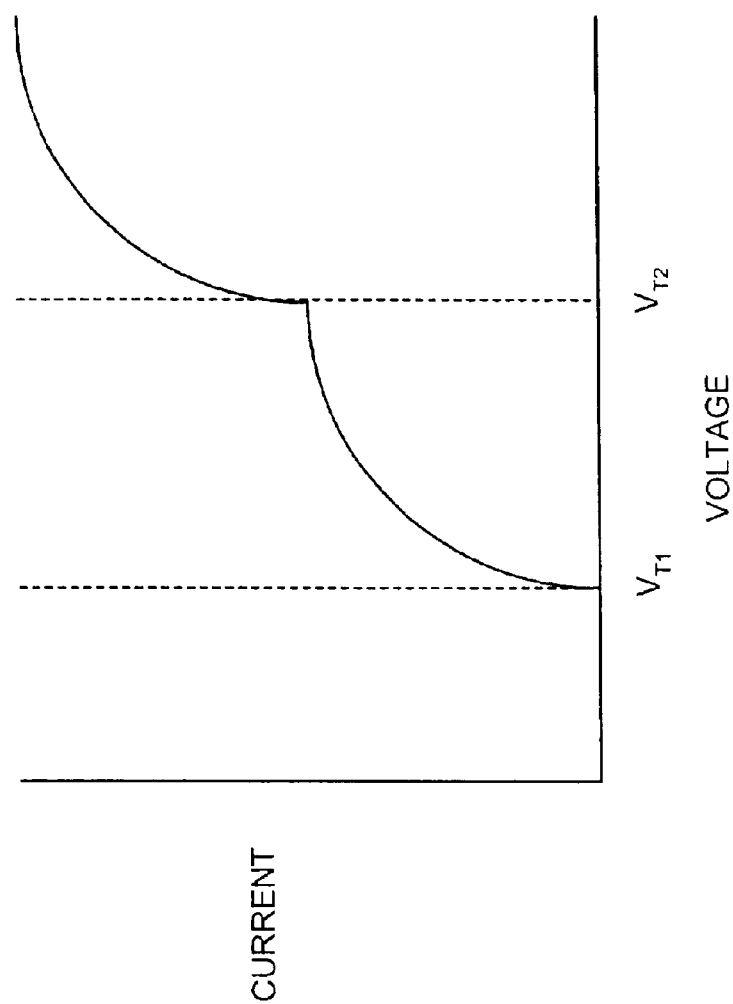

The resulting FinFET device has two specific threshold voltages, thereby providing ratioed current. FIG. 13 is a graph illustrating effects on current for changes in voltage in such a FinFET device.

CONCLUSION

Systems and methods consistent with the principles of the invention provide tightly spaced n-channel and p-channel fins for a FinFET device. In implementations consistent with the present invention, the fins may be doped using shadowed implant techniques.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention.

For example, in the above descriptions, numerous specific details are set forth, such as specific materials, structures, chemicals, processes, etc., in order to provide a thorough understanding of implementations consistent with the present invention. These implementations and other implementations can be practiced, however, without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, nondependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A method of doping fins of a semiconductor device that includes a substrate the method comprising:

forming a plurality of fin structures on the substrate, each of the fin structures including a cap formed on a fin;

performing a first tilt angle implant process to selectively dope a first one of the fins with n-type impurities; and performing a second tilt angle implant process to selectively dope a second one of the fins with p-type impurities.

2. The method of claim 1, wherein a width of each of the fin structures ranges from about 200 Å to about 300 Å.

3. The method of claim 1, wherein a distance between side surfaces of the fin structures ranges from about 200 Å to about 300 Å.

4. The method of claim 1, wherein a height of the fins each ranges from about 200 Å to about 300 Å.

5. The method of claim 1, wherein the first tilt angle implant process is performed at an angle ranging from about 40 degrees to about 50 degrees.

6. The method of claim 1, wherein the second tilt angle implant process is performed at an angle ranging from about 40 degrees to about 50 degrees.

7. The method of claim 1, further comprising:

performing a third tilt angle implant process to further dope first one of the fins with n-type impurities; and performing a fourth tilt angle implant process to further dope second one of the fins with n-type impurities.

8. The method of claim 7, wherein the third tilt angle implant process is performed at an angle ranging from about 40 degrees to about 50 degrees.

9. The method of claim 7, wherein the fourth tilt angle implant process is performed at an angle ranging from about 40 degrees to about 50 degrees.

10. The method of claim 7, further comprising:

forming hardened resists on non-shadowed side surfaces of the first and second ones of the fins prior to performing the third and fourth tilt angle implant processes.

11. A method for doping fins of a semiconductor device that includes a substrate, the method comprising:

forming a plurality of fin structures on the substrate, each of the fin structures including a cap portion formed on a fin portion;

performing a first tilt angle implant process to selectively dope a first one of the fin portions with n-type impurities from a first direction;

performing a second tilt angle implant process to selectively dope a second one of the fin portions with p-type impurities from a second direction;

performing a third tilt angle implant process to further dope the first one of the fin portions with n-type impurities from the second direction; and performing a fourth tilt angle implant process to further dope the second one of the fin portions with p-type impurities from the first direction.

12. The method of claim 11, wherein the first tilt angle implant process is performed at an angle ranging from about 40 degrees to about 50 degrees and the second tilt angle implant process is performed at an angle ranging from about 40 degrees to about 50 degrees.

13. The method of claim 11, wherein the third tilt angle implant process is performed at an angle ranging from about 40 degrees to about 50 degrees and the fourth tilt angle implant process is performed at an angle ranging from about 40 degrees to about 50 degrees.

14. The method of claim 11, wherein the third and fourth tilt angle implant processes are performed at angles steeper than angles of the first and second tilt angle implant processes.

15. The method of claim 11, wherein a distance between side surfaces of the fin structures ranges from about 200 Å to about 300 Å.

* * * * *

UNITED STATES PATENT AND TRADEMARK OFFICE
CERTIFICATE OF CORRECTION

PATENT NO. : 6,787,406 B1
DATED : September 7, 2004
INVENTOR(S) : Wiley Eugene Hill et al.

It is certified that error appears in the above-identified patent and that said Letters Patent is hereby corrected as shown below:

Column 1,
Line 41, replace "strictures" with -- structures --;

Column 2,
Line 42, replace "alterative" with -- alternative --;

Column 3,
Line 1, replace "wellknown" with -- well-known --;

Column 5,
Line 67, replace "maybe" with -- may be --;

Column 6,
Line 38, replace "nondependent" with -- non-dependent --;
Line 63, insert -- each of -- after "of" (second occurrence) and delete "each";

Column 7,
Line 8, change "n-type" to -- p-type --.

Signed and Sealed this

Fourteenth Day of December, 2004

JON W. DUDAS
*Director of the United States Patent and Trademark Office*